United States Patent
Tsai

(10) Patent No.: US 7,393,797 B2
(45) Date of Patent: Jul. 1, 2008

(54) METHOD FOR THERMAL PROCESSING A SEMICONDUCTOR WAFER

(75) Inventor: Tsung-Hsun Tsai, Tai-Nan (TW)

(73) Assignee: United Microelectronics Corp., Hsin-Chu (TW)

(*) Notice: Subject to any disclaimer, the term of this patent is extended or adjusted under 35 U.S.C. 154(b) by 27 days.

(21) Appl. No.: 11/463,302

(22) Filed: Aug. 8, 2006

(65) Prior Publication Data

US 2006/0292895 A1    Dec. 28, 2006

Related U.S. Application Data

(62) Division of application No. 11/160,199, filed on Jun. 13, 2005.

(51) Int. Cl.
*H01L 21/324* (2006.01)
(52) U.S. Cl. .................. 438/795; 257/E21.001; 392/416; 392/418
(58) Field of Classification Search .................. 438/795
See application file for complete search history.

(56) References Cited

U.S. PATENT DOCUMENTS

| | | | |
|---|---|---|---|
| 5,654,904 A * | 8/1997 | Thakur ........... | 702/137 |
| 5,881,208 A * | 3/1999 | Geyling et al. ........ | 392/418 |
| 6,005,226 A | 12/1999 | Aschner | |
| 6,072,163 A | 6/2000 | Armstrong et al. | |
| 6,110,289 A | 8/2000 | Moore | |
| 6,121,061 A | 9/2000 | Van Bilsen et al. | |
| 6,192,601 B1 | 2/2001 | Ghanayem | |
| 6,362,081 B1 | 3/2002 | Chuang | |
| 6,436,846 B1 | 8/2002 | Tews | |

(Continued)

FOREIGN PATENT DOCUMENTS

TW    416112    12/2000

(Continued)

OTHER PUBLICATIONS

Kuznetsov, V.I.; van Zutphen, A.J.M.M.;Kerp, H.R.; Vermont, P.G.; Pages, X.; van Hapert, J.J.; van der Jeugd, K.; Granneman, E.H.A., Continuity in the development of ultra shallow junctions for 130-45 nm CMOS: the tool and annealing methods, Advanced Thermal Processing of Semiconductors, 2003. RTP 2003. 11th IEEE International Conference on, Sep. 23-26, 2003, p. 63-74.

*Primary Examiner*—Alexander G Ghyka
(74) *Attorney, Agent, or Firm*—Winston Hsu

(57) ABSTRACT

A method for thermal processing a semiconductor wafer is disclosed. A rapid thermal processing (RTP) chamber encompasses a heating means, a rotation means, and a cooling system for cooling walls of said RTP chamber. A semiconductor wafer is loaded into the RTP chamber just being cooling down to a first temperature by using the cooling system. When loading the semiconductor wafer, it has a temperature that is lower than the first temperature, thereby causing a tendency of particle deposition from the walls of the RTP chamber onto the semiconductor wafer. The semiconductor wafer is pre-heated to a second temperature higher than the first temperature with the heating means, thereby eliminating the tendency of particle deposition. Upon reaching the second temperature, the rotation means is activated to start to rotate the semiconductor wafer, while the semiconductor wafer being ramped up to a third temperature.

12 Claims, 5 Drawing Sheets

U.S. PATENT DOCUMENTS

| | | |
|---|---|---|
| 6,449,428 B2 | 9/2002 | Aschner |
| 6,600,138 B2 | 7/2003 | Hauf et al. |
| 6,809,035 B2 | 10/2004 | Yoo |
| 6,839,507 B2 | 1/2005 | Adams et al. |
| 7,112,763 B2 | 9/2006 | Hunter et al. |
| 7,321,722 B2 * | 1/2008 | Tsai .......................... 392/416 |
| 2002/0026900 A1 * | 3/2002 | Huang et al. ................ 118/730 |
| 2002/0043526 A1 * | 4/2002 | Blanter ....................... 219/390 |
| 2002/0068411 A1 | 6/2002 | Chiang et al. |
| 2005/0011457 A1 | 1/2005 | Chiang et al. |
| 2006/0021582 A1 | 2/2006 | Saito et al. |
| 2006/0030165 A1 * | 2/2006 | Ingle et al. .................. 438/795 |
| 2006/0035477 A1 * | 2/2006 | Mai et al. .................... 438/795 |

FOREIGN PATENT DOCUMENTS

| | | |
|---|---|---|
| TW | 451360 | 8/2001 |
| TW | 540120 | 7/2003 |

* cited by examiner

METHOD FOR THERMAL PROCESSING A SEMICONDUCTOR WAFER

CROSS REFERENCE TO RELATED APPLICATIONS

This is a divisional application of U.S. application Ser. No. 11/160,199 filed Jun. 13, 2005.

BACKGROUND OF THE INVENTION

1. Field of the Invention

The present invention relates to rapid thermal processing (RTP) of semiconductor wafers and, more particularly, to a radiation-first RTP method for uniformly thermal-processing a rotating semiconductor wafer.

2. Description of the Prior Art

Rapid thermal processing (hereinafter referred to as "RTP") methods and RTP systems are known in the art. A RTP chamber refers to a device that rapidly heats objects, such as semiconductor wafers. Such devices typically include a substrate holder for holding a semiconductor wafer and an energy source for heating the wafer. During heat treatment, the semiconductor wafers are heated under controlled conditions according to a pre-set temperature regime. For monitoring the temperature of the semiconductor wafer during heat treatment, thermal processing chambers also include radiation sensor devices, such as pyrometers, that sense the radiation being emitted by the semiconductor wafer at a selected wavelength. By sensing the thermal radiation being emitted by the wafer, the temperature of the wafer can be calculated with reasonable accuracy.

The thrust of the work was increasing the temperature uniformity, and developing heating cycles and processes which decreased the thermal budget. Prior art RTP chambers can heat unstructured, homogeneous materials in the form of a flat plate or disk, and produce temperature uniformities across the plate adequate for semiconductor processing processes.

The wafers are generally inserted into a chamber with at least some portions of the chamber walls transparent to transmit radiation from powerful heating lamps. These lamps are generally tungsten-halogen lamps, but arc lamps or any other source of visible and/or near infrared radiation may be used. The radiation from the lamps is directed through the transparent portions of the walls on to the surface of the wafer to be heated.

FIG. 1 shows a cross-sectional sketch of a prior art RTP chamber 10 with a wafer 12 supported by quartz pins 14 in position for heating by radiation from a set of lamps 16 and 18. The chamber 10 is supported by a housing 20 having highly polished interior walls 22. A door 24 is used to make a gas tight seal for the chamber 10. The temperature of the wafer 10 is measured by a pyrometer 26. A computer 32 receives the temperature reading from the pyrometer 26, and controls the lamps 16 and 18 to heat the wafer 12 according to a preprogrammed schedule. The computer 32 also serves to control a gas flow controller 30, which introduces process gas 28 into the chamber 10.

Rotation of susceptors bearing wafers is well known as a means of ensuring uniform heating and growth of films in semiconductor processes. FIG. 2 depicts a flow chart according to a prior art RTP method. After loading the wafer into the cooled down RTP chamber (Step 42), the wafer, which is supported by the quartz pins and has a temperature (typically room temperature) that is lower than the chamber walls that are just cooled down to about 30-80° C., starts to rotate (Step 44). Processing gas, if necessary, is then flowed into the chamber (Step 46). A pre-set heating program, which is stored in and executed by the computer, is then activated to heat the wafer in either a soak mode or a spike mode for a pre-selected time period (Step 48). However, the prior art method for thermal processing a wafer arises particle problems.

SUMMARY OF THE INVENTION

The primary object of the present invention is to provide a radiation-first RTP method for solving the particle problems.

According to the claimed invention, a method for thermal processing a semiconductor wafer is disclosed. A rapid thermal processing (RTP) chamber comprising at least a radiation source for heating an object, a rotation means for rotating the object, and a cooling system for cooling walls of the RTP chamber is prepared. A semiconductor wafer is loaded into the RTP chamber. At this point, the walls of the RTP chamber have just been cooling down to a first temperature by using the cooling system. The semiconductor wafer is then pre-heated to a second temperature with the radiation source. The second temperature is higher than the first temperature. Upon reaching the second temperature, the rotation means is just activated to start to rotate the semiconductor wafer that is disposed on quartz pins, while the semiconductor wafer being ramped up to a third temperature of 700-1100° C.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention pertains to a newly designed radiation-first RTP method for alleviating or eliminating particle problem thereof. As mentioned, rotation of susceptors bearing wafers is employed to uniformly heat wafers. After thermal processing a wafer, a succeeding wafer, which is typically transported at room temperature, is loaded into the cooled down RTP chamber.

In order to speed up the throughput of the volume production of ICs and some other reasons, the RTP chamber are ordinarily cooled down to about a temperature of about 30-80° C., instead of room temperature. Upon the loading of the succeeding wafer, the susceptor starts to rotate. Processing gas, if necessary, is then flowed into the chamber. A pre-set heating program, which is stored in and executed by a computer, is then activated to heat the wafer in either a "soak" mode or a "spike" mode for a pre-selected time period, for example, 30-90 seconds.

It is discovered that after batches of wafers for RTP heat treatment, the interior walls of the RTP chamber would absorb and accumulate particles. It is further discovered by the inventor that the prior art rotation-first RTP sequence would cause the particles to move from hotter walls of the RTP chamber to a relatively colder surface of the rotating wafer just loaded into the RTP chamber, and thus contaminating the wafer. The tendency of particles deposition on the colder surfaces of the wafer at the earlier stage of the RTP treatment adversely affects the preciseness and accuracy of the subsequent lithographic processes and hence deteriorates the quality of the integrated circuits. It is one purpose of the present invention to eliminate such tendency.

The radiation-first RTP method according to this invention is carried out in a RTP system that is capable of thermal processing the semiconductor wafer while rotating the wafer. Such RTP system is available from Applied Materials, Inc., Mattson Technology, Inc., or Steag AST, among others. For example, the radiation-first RTP method of this invention can be performed in a Steag AST 3000 RTP tool. Typically, such RTP tool comprises a RTP chamber, wherein one wall of the chamber supporting a wafer rotates with respect to the rest of the chamber so that the wafer being treated in the RTP chamber is relatively rotated with respect to the radiation source such as halogen lamps or tungsten lamps that heats the wafer. The walls of the RTP chamber have at least a portion transparent to the radiation from the halogen lamps.

Figure 1:
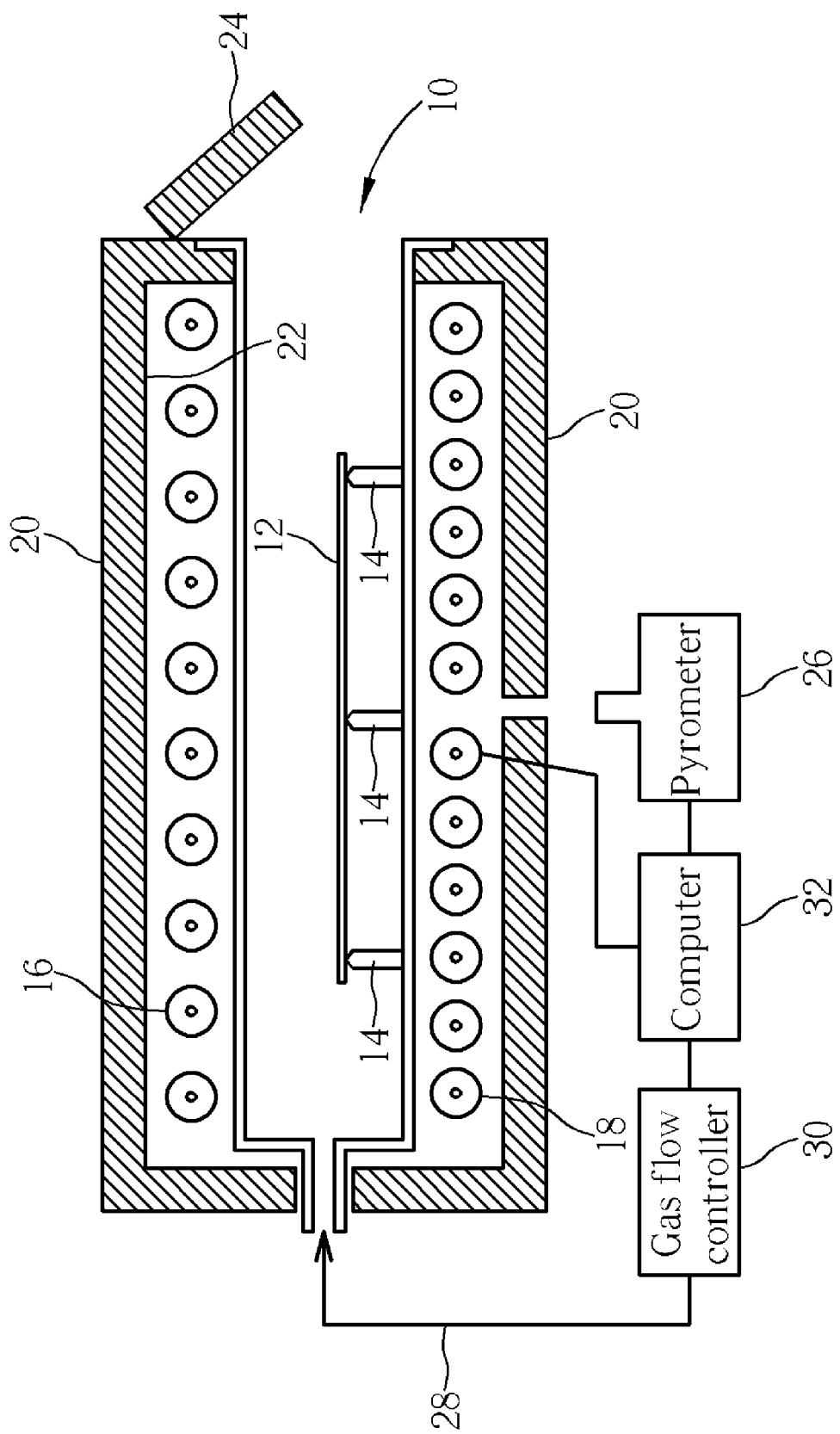
FIG. 1 is a schematic, cross-sectional diagram showing a prior art RTP chamber with a wafer supported by quartz pins in position for heating by radiation from a set of lamps.
Figure 2:
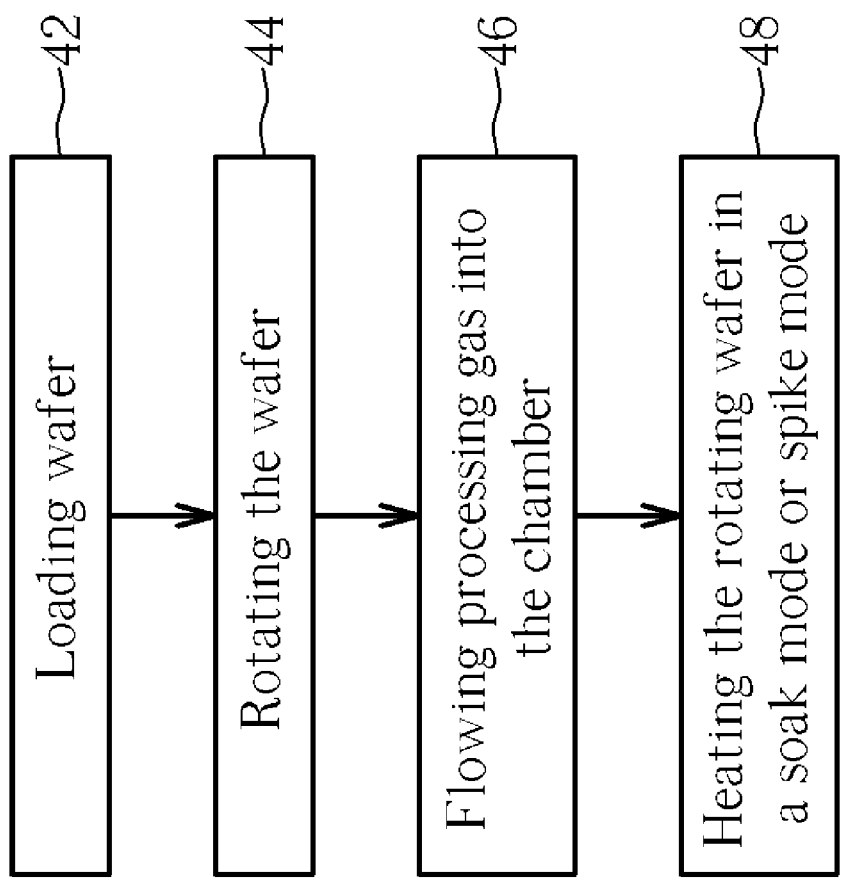
FIG. 2 depicts a flow chart according to a prior art RTP method.
Figure 3:
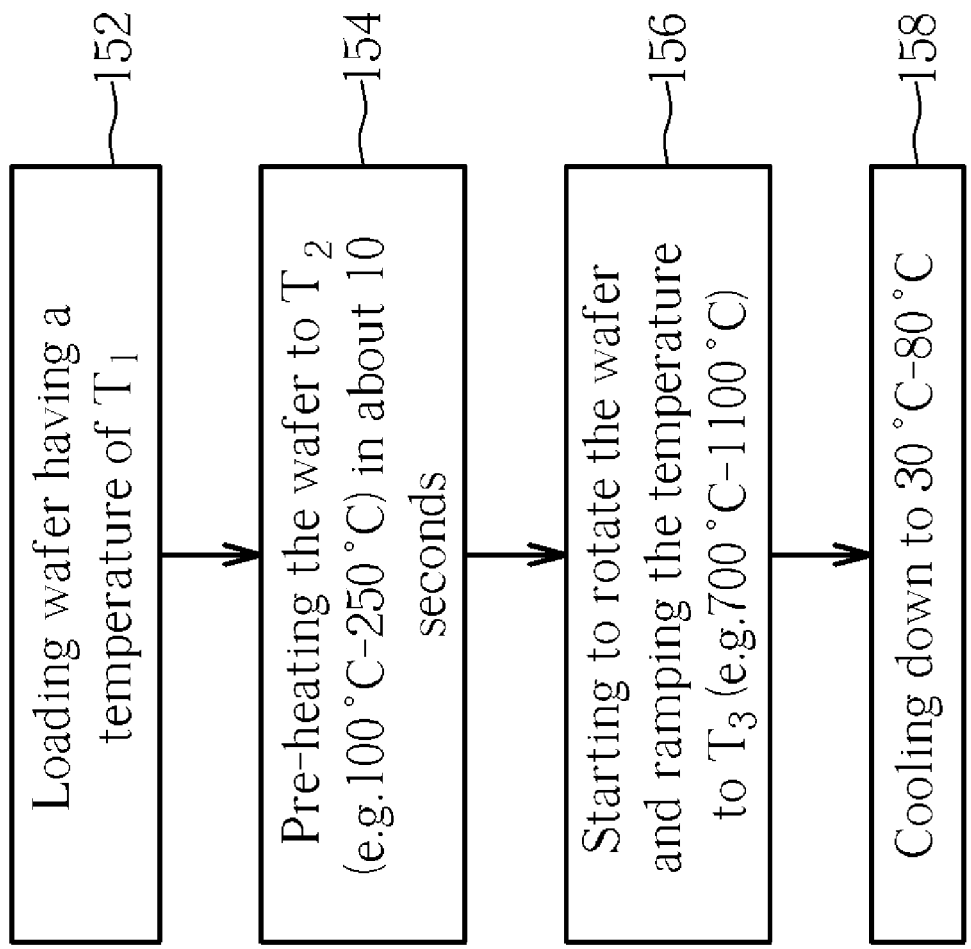
FIG. 3 is a flow chart of the radiation-first RTP method in accordance with one preferred embodiment of the present invention.

Please refer to FIG. 3. FIG. 3 is a flow chart of the radiation-first RTP method in accordance with one preferred embodiment of the present invention. As shown in FIG. 3, the radiation-first RTP method starts with Step 152: loading a wafer into a RTP chamber as described. The wafer is supported with quartz pins that are disposed in the RTP chamber. Before rotating the wafer, a pre-set heating program that is stored and executed in a computer of the RTP tool is activated. The computer controls a rotation means, power of radiation source, and flowrate of a processing gas.

The pre-set heating program includes a pre-heat stage that rapidly raises the temperature of the static (not-rotating) wafer from $T_1$ (about room temperature) to a higher temperature $T_2$ ranging between 100° C. and 250° C. (Step 154). According to this invention, the pre-heat stage is controlled by a close-loop and heated at a fixed power, and it usually takes about 5-30 seconds to reach $T_2$. Since the walls of the RTP chamber are cooled by a cooling water system, the temperature of the walls is not raised up as fast as the wafer does. The walls of the RTP chamber now become relatively colder than the surfaces of the wafer after the pre-heating of the wafer.

Upon reaching $T_2$, the present invention method immediately proceeds to Step 156: starting to rotate the wafer and ramping the temperature up to the highest temperature $T_3$ ranging between about 700° C. and about 1100° C. The rotation of the wafer may be driven by mechanical means such as a combination of shaft and gear drive, or by other means such as magnetic means, or gas-driven. According to the preferred embodiment of this invention, the rotation speed of the wafer is about 70-85 rpm. It is noted that the rotation means will not be activated until the pre-heating of the wafer is completed.

In Step 156, the temperature of the wafer continues to be raised up from $T_2$ to $T_3$ at the above-mentioned fixed power. The exact temperature value of $T_3$ depends upon the purposes of the RTP treatment. Typically, $T_3$ ranges between 700° C. and 1100° C., but should not be limiting.

Figure 4:
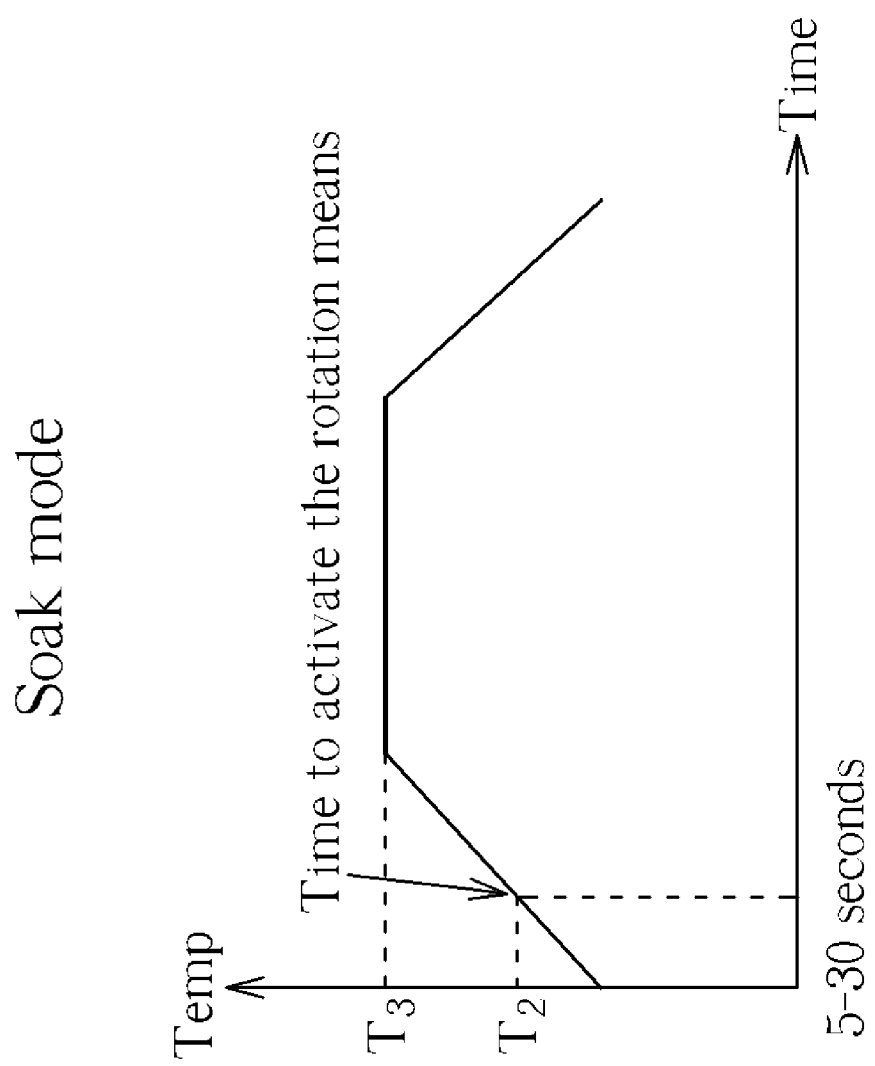
FIG. 4 is a Temperature vs. Time plot illustrating a RTP heating program in a "soak" mode in accordance with this invention.
Figure 5:
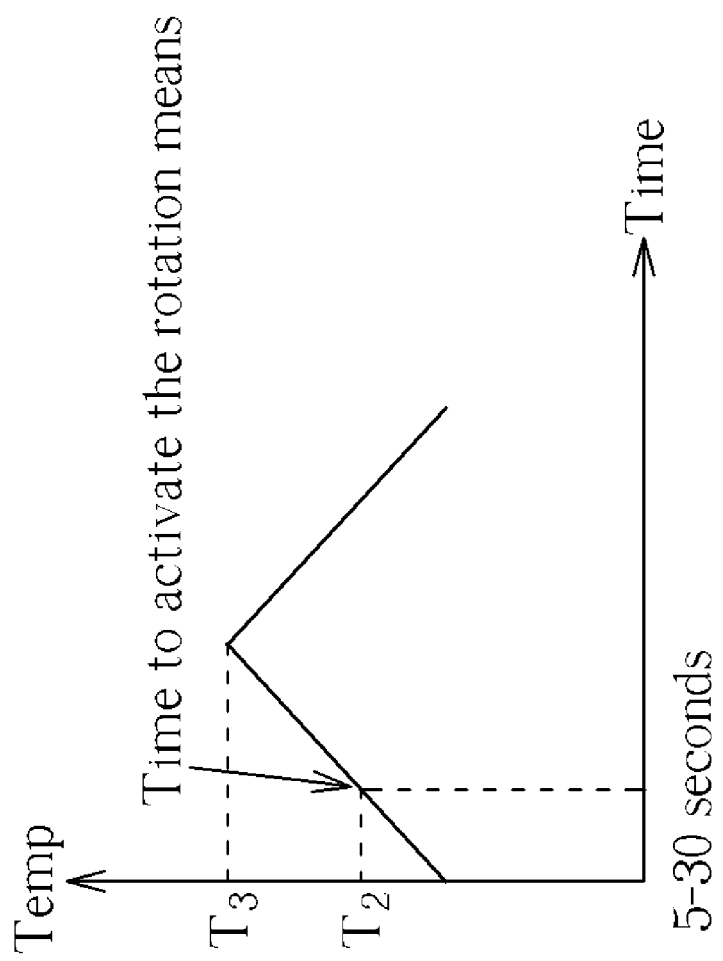
FIG. 5 is a Temperature vs. Time plot illustrating a RTP heating program in a "spike" mode in accordance with this invention.

There are two ordinary RTP modes, which are so-called "soak" mode and "spike" mode, which are depicted in FIG. 4 and FIG. 5, respectively. The timing of activating the rotation means of the RTP system is also indicated. In FIG. 4, after the temperature reaches T3, the temperature is maintained and fixed at this temperature for a time period of, for example, 30-90 seconds, as a plateau region that can be seen in this figure. After this, the wafer is cooled down to 30-80° C. (Step 158). In FIG. 5, a "spike" mode RTP heating program is illustrated. When employing the "spike" mode, there is no such plateau region as shown in FIG. 4. After reaching T3, the wafer is immediately cooled down to 30-80° C. in the spike RTP.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for thermal processing a semiconductor wafer, comprising:
   providing a rapid thermal processing (RTP) chamber comprising at least a radiation source for heating an object, a rotation means for rotating said object, and a cooling system for cooling walls of said RTP chamber;
   loading a semiconductor wafer into said RTP chamber just being cooled down to a first temperature by said cooling system;
   pre-heating said semiconductor wafer to a second temperature with said radiation source, wherein said second temperature is higher than said first temperature; and
   upon reaching said second temperature, activating said rotation means to start to rotate said semiconductor wafer, while said semiconductor wafer is being ramped up to a third temperature.

2. The method for thermal processing a semiconductor wafer according to claim 1 wherein said pre-heating step is completed in 30 seconds.

3. The method for thermal processing a semiconductor wafer according to claim 1 wherein said first temperature ranges between 30-80° C.

4. The method for thermal processing a semiconductor wafer according to claim 1 wherein said second temperature ranges between 100-250° C.

5. The method for thermal processing a semiconductor wafer according to claim 1 wherein said third temperature ranges between 700-1100° C.

6. The method for thermal processing a semiconductor wafer according to claim 1 wherein said rotation means is a mechanical rotation means including a combination of shaft and gear drive.

7. The method for thermal processing a semiconductor wafer according to claim 1 wherein said rotation means is a magnetic rotation means.

8. The method for thermal processing a semiconductor wafer according to claim 1 wherein said rotation means is gas-driven.

9. The method for thermal processing a semiconductor wafer according to claim 1 wherein said RTP chamber farther equipped with a computer that controls said rotation means, power of said radiation source, and flowrate of a processing gas.

10. The method for thermal processing a semiconductor wafer according to claim 1 wherein said third temperature is maintained for a pre-selected time period.

11. The method for thermal processing a semiconductor wafer according to claim 1 wherein upon reaching said third temperature, said semiconductor wafer is immediately cooled down.

12. The method for thermal processing a semiconductor wafer according to claim 1 wherein said radiation source comprises halogen lamps and tungsten lamps.

* * * * *